(12) United States Patent
Antonelli et al.

(10) Patent No.: US 8,084,339 B2
(45) Date of Patent: Dec. 27, 2011

(54) REMOTE PLASMA PROCESSING OF INTERFACE SURFACES

(75) Inventors: George Andrew Antonelli, Portland, OR (US); Jennifer O'Loughlin, Portland, OR (US); Tony Xavier, West Linn, OR (US); Mandyam Sriram, Beaverton, OR (US); Bart Van Schravendijk, Sunnyvale, CA (US); Vishwanathan Rangarajan, Beaverton, OR (US); Seshasayee Varadarajan, Lake Oswego, OR (US); Bryan L. Buckalew, Tualatin, OR (US)

(73) Assignee: Novellus Systems, Inc., San Jose, CA (US)

( * ) Notice: Subject to any disclaimer, the term of this patent is extended or adjusted under 35 U.S.C. 154(b) by 19 days.

(21) Appl. No.: 12/484,047

(22) Filed: Jun. 12, 2009

(65) Prior Publication Data

US 2010/0317178 A1 Dec. 16, 2010

(51) Int. Cl.
*H01L 21/261* (2006.01)
(52) U.S. Cl. ... 438/512; 438/692; 438/740; 257/E21.17; 257/E21.006; 257/E21.27; 257/E21.054; 257/E21.134; 257/E21.267; 257/E21.304; 257/E21.311; 257/E21.329
(58) Field of Classification Search ............ 438/512, 438/513, 514, 463, 535, 679, 681, 687, 692, 438/740, 931; 257/E21.17, E21.006, E21.027, 257/E21.054, E21.134, E21.267, E21.304, 257/E21.311, E21.329
See application file for complete search history.

(56) References Cited

U.S. PATENT DOCUMENTS

| | | | | |
|---|---|---|---|---|
| 6,007,675 A | * | 12/1999 | Toshima | 156/345.32 |
| 6,224,680 B1 | * | 5/2001 | Toshima | 118/719 |
| 6,500,357 B1 | * | 12/2002 | Luo et al. | 216/79 |
| 6,841,006 B2 | * | 1/2005 | Barnes et al. | 118/719 |
| 6,855,225 B1 | | 2/2005 | Su et al. | |
| 6,949,203 B2 | * | 9/2005 | Hsieh et al. | 216/67 |
| 7,244,683 B2 | * | 7/2007 | Chung et al. | 438/758 |
| 7,622,162 B1 | * | 11/2009 | van Schravendijk et al. | 427/553 |
| 2004/0200244 A1 | | 10/2004 | Hong et al. | |
| 2005/0085090 A1 | | 4/2005 | Mui et al. | |
| 2009/0014324 A1 | | 1/2009 | Kawaguchi et al. | |
| 2010/0317198 A1 | * | 12/2010 | Antonelli et al. | 438/758 |

FOREIGN PATENT DOCUMENTS

WO  2010/144290  12/2010

OTHER PUBLICATIONS

Kamian, George et al., "Ultraviolet Light Treatment Load Lock for Dielectric Films," U.S. Appl. No. 11/561,834, filed Nov. 20, 2006, 26 pages.

(Continued)

*Primary Examiner* — David Nhu
(74) *Attorney, Agent, or Firm* — Weaver Austin Villeneuve & Sampson LLP

(57) ABSTRACT

Embodiments related to the cleaning of interface surfaces in a semiconductor wafer fabrication process via remote plasma processing are disclosed herein. For example, in one disclosed embodiment, a semiconductor processing apparatus includes a processing chamber, a load lock coupled to the processing chamber via a transfer port, a wafer pedestal disposed in the load lock and configured to support a wafer in the load lock, a remote plasma source configured to provide a remote plasma to the load lock, and an ion filter disposed between the remote plasma source and the wafer pedestal.

16 Claims, 7 Drawing Sheets

OTHER PUBLICATIONS

Rivkin, Michael et al., "Load Lock Design for Rapid Wafer Heating," U.S. Appl. No. 11/608,185, filed Dec. 7, 2006, 33 pages.

Van Schravendijk, Bart et al., "UV Treatment of Etch Stop and Hard Mask Films for Selectivity and Hermeticity Enhancement," U.S. Appl. No. 11/696,102, filed Apr. 3, 2007, 23 pages.

Gonella, R. et al., "Assessment of copper contamination impact on inter-level dielectric reliability performed with time-dependent-dielectric-breakdown tests," *Microelectronics Reliability*, vol. 40, Iss. 8, pp. 1305-1309, Aug. 2000, 5 pages.

U.S. Appl. No. 13/019,854, "Remote plasma processing of interface surfaces", Antonelli et al., filed Feb. 2, 2011.

U.S. Appl. No. 61/445,282, "Load lock assembly and method for particle reduction", Pandit et al., filed Feb. 22, 2011.

WO patent application No. PCT/US2010/037115, International Search Report mailed Dec. 20, 201.

* cited by examiner

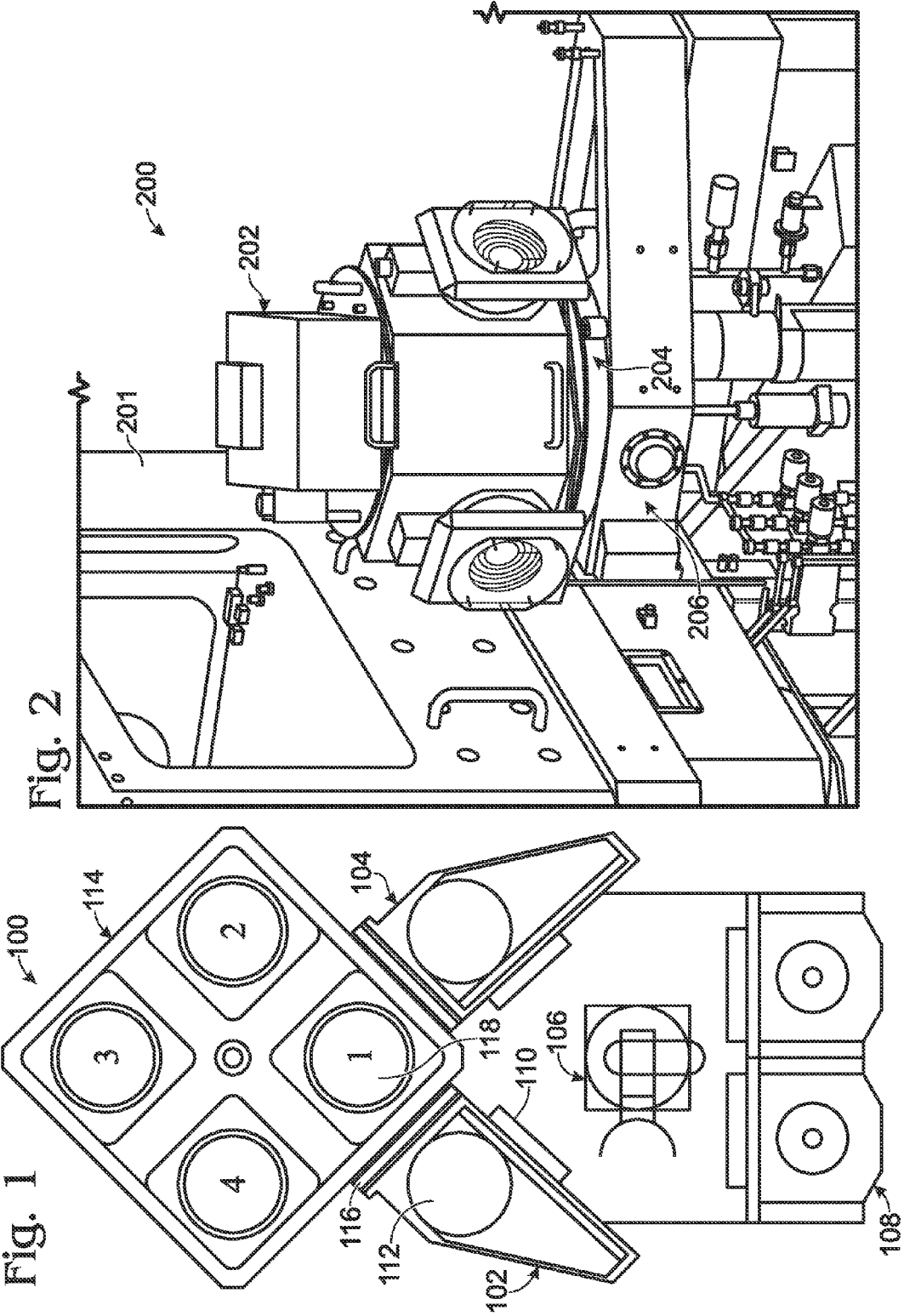

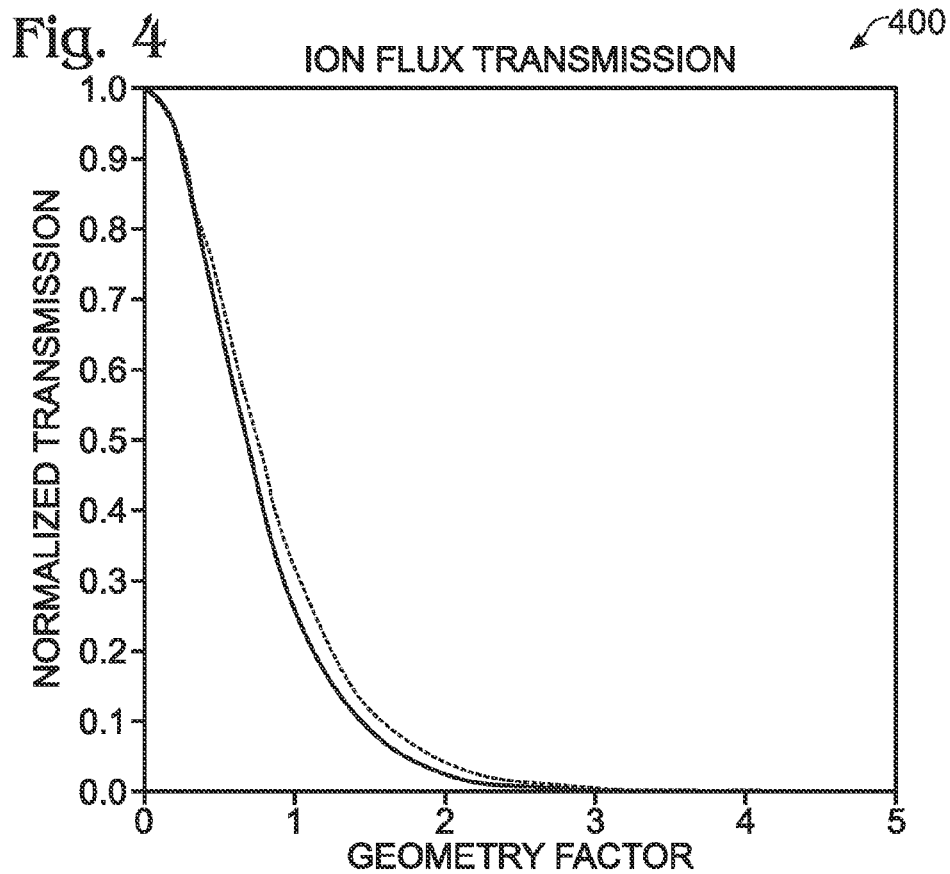
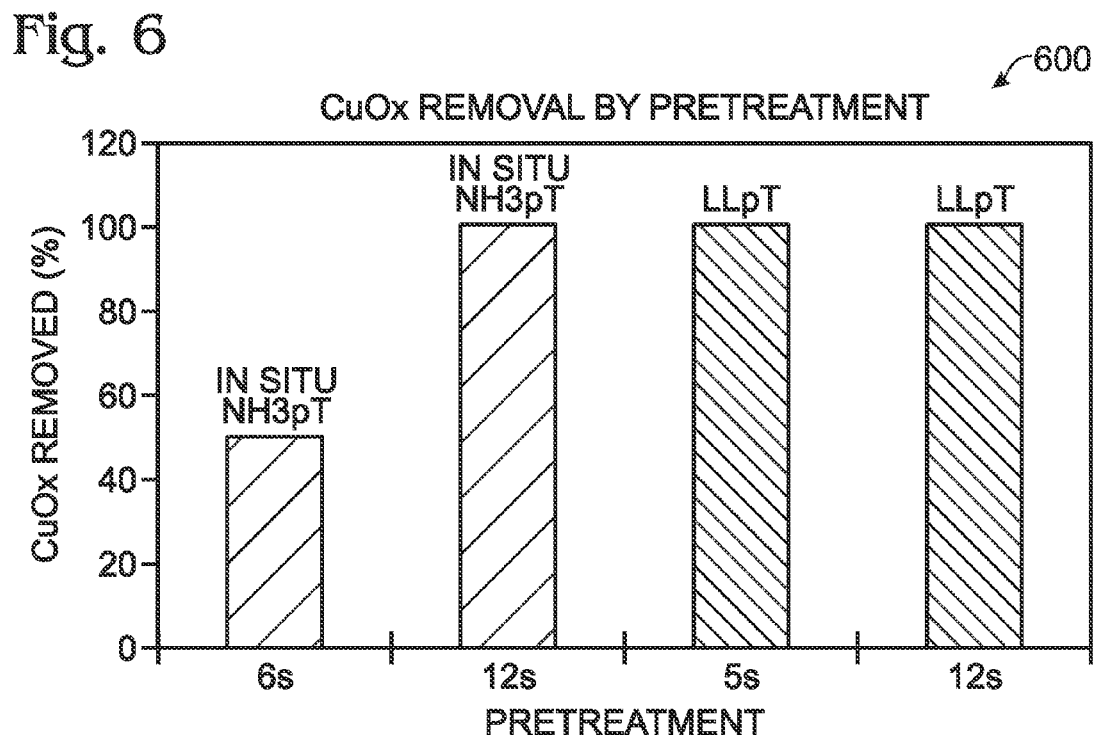

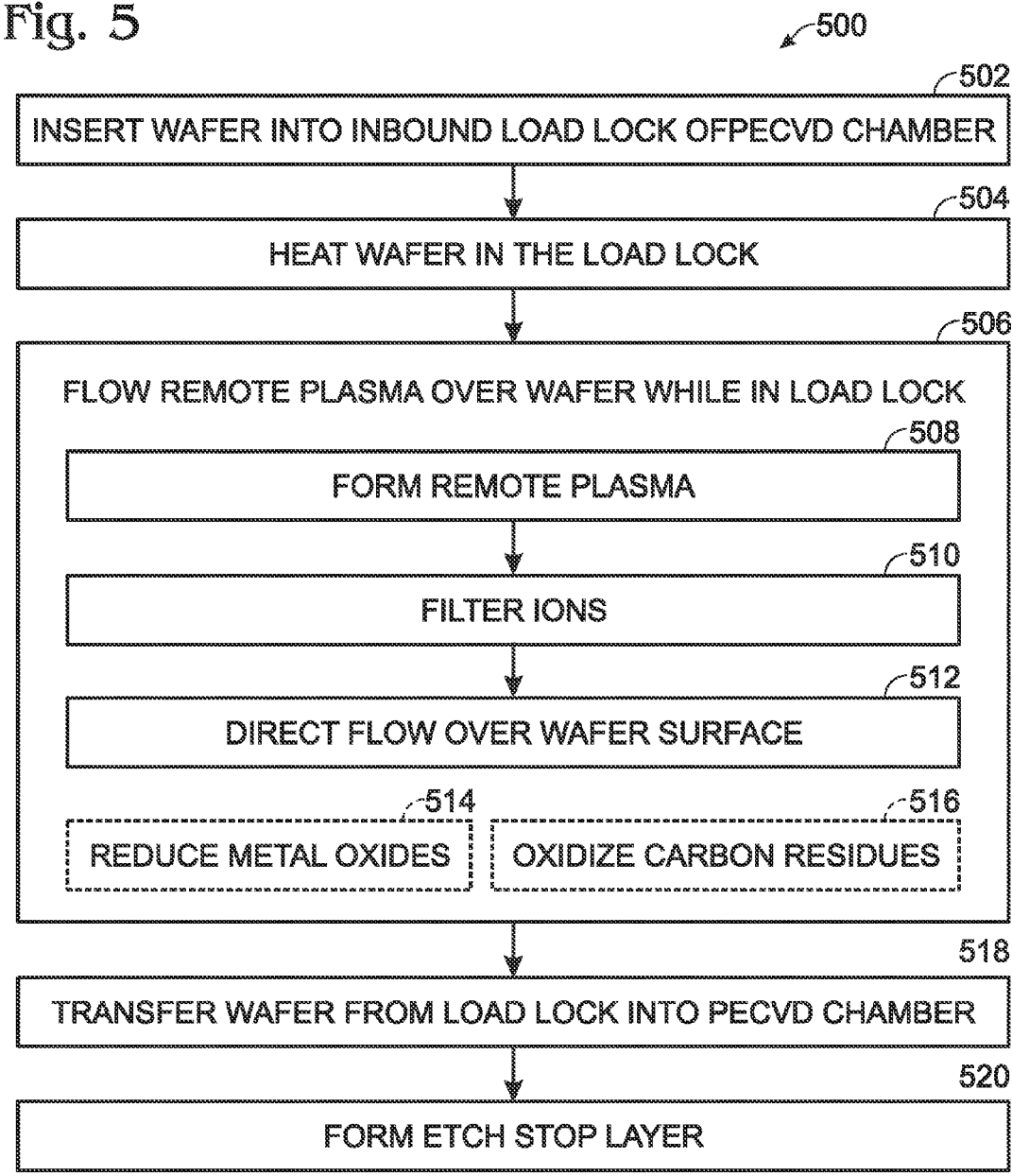

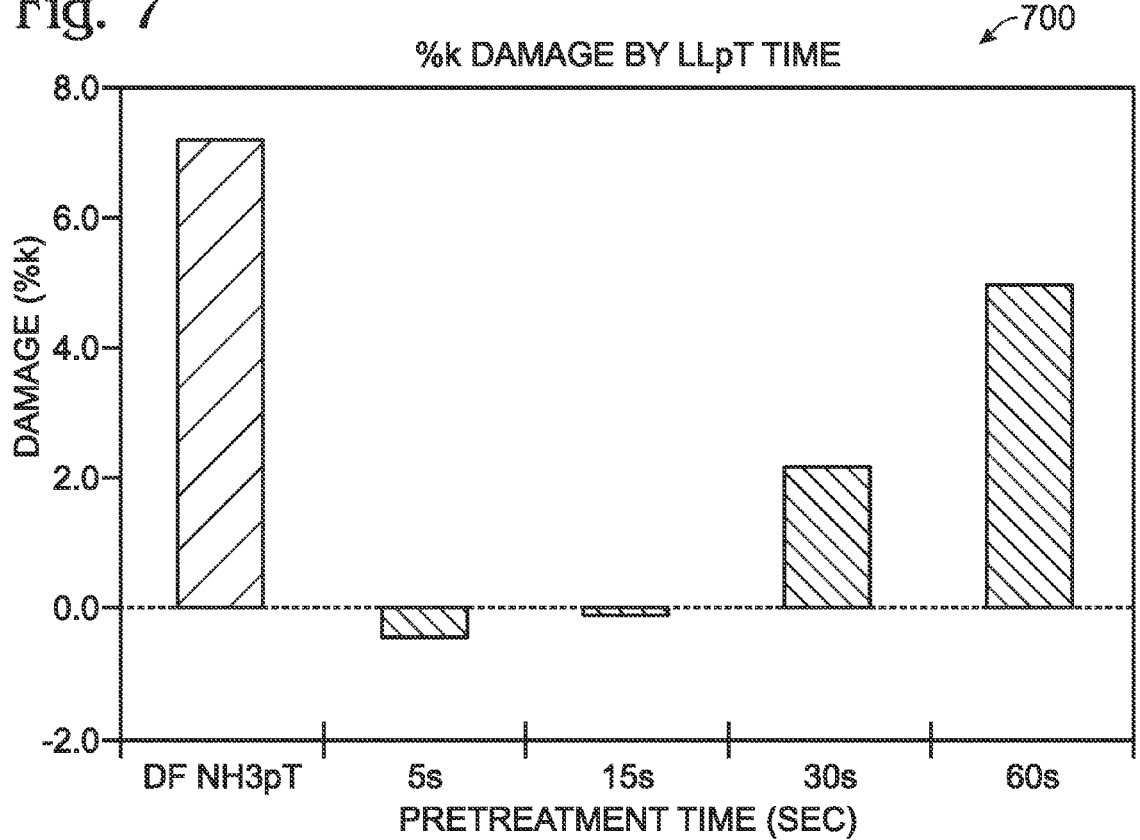

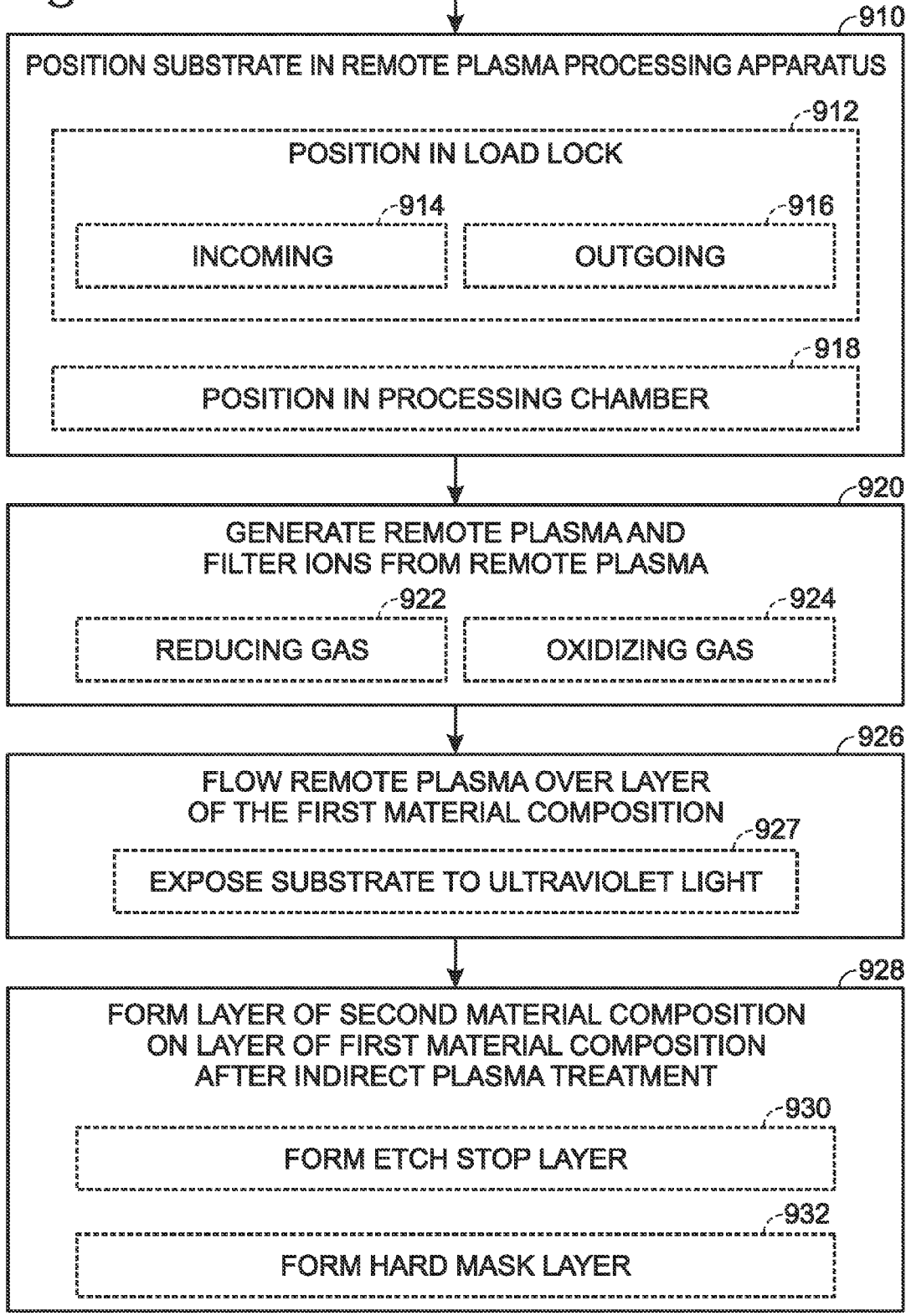

REMOTE PLASMA PROCESSING OF INTERFACE SURFACES

BACKGROUND

Various processes in semiconductor device manufacturing involve depositing a layer of a first composition over a layer of a second composition. In some situations, the surface of the underlying film may comprise impurities that can affect the adhesion of the two layers, as well as other mechanical and/or electrical properties of a semiconductor device. For example, in an example Damascene process flow, a metal is deposited onto a patterned dielectric layer to fill vias and trenches formed in the dielectric layer. Then, excess metal is removed via chemical mechanical polishing (CMP), thereby forming a planar surface comprising regions of exposed copper and low-k dielectric onto which other layers, such as a silicon carbide etch stop layer, are deposited.

Exposed copper regions may be subject to oxidation prior to the formation of subsequent layers. Similarly, hydrocarbon residues may remain on a wafer surface after a CMP process. The presence of copper oxide may cause problems with the adhesion of an etch stop film on the exposed copper portions of the wafer. Therefore, various cleaning processes may be used to remove such copper. In one specific example, such a wafer may be exposed to a direct plasma in a plasma-enhanced chemical vapor deposition (PECVD) processing chamber for a period of time prior to introducing chemical vapors to the processing chamber. The use of a reducing plasma, such as an ammonia or hydrogen plasma, may reduce copper oxide and hydrocarbons on the surface, thereby cleaning the surface. However, depending upon processing conditions, such direct plasmas also may affect a low-k dielectric surrounding the copper. Further, the use of an in situ plasma cleaning process step in a PECVD chamber may reduce overall PECVD system throughput.

SUMMARY

Accordingly, various embodiments related to the cleaning of interface surfaces in a semiconductor wafer via remote plasma processing are disclosed herein. For example, in one disclosed embodiment, a semiconductor processing apparatus comprises a processing chamber, a load lock coupled to the processing chamber via a transfer port, a wafer pedestal disposed in the load lock and configured to support a wafer in the load lock, a remote plasma source configured to provide a remote plasma to the load lock, and an ion filter disposed between the remote plasma source and the wafer pedestal.

In another disclosed embodiment, a method of forming an interface between two layers of different material compositions comprises forming a layer of a first material composition on a substrate, positioning the substrate in a remote plasma processing apparatus, generating a remote plasma and filtering ions from the remote plasma, flowing the remote plasma over a surface of the layer of the first material composition, and forming a layer of a second material composition on the surface of the layer of the first material composition to thereby form the interface between the two layers of different material compositions.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 1 shows a schematic diagram of an embodiment of a semiconductor processing system.

FIG. 2 shows a view of an embodiment of a semiconductor processing chamber coupled to an embodiment of a load lock comprising a remote plasma source.

FIG. 4 shows a graphical depiction of an ion flux transmission as a function of a through-hole aspect ratio in an embodiment of an ion filter.

FIG. 5 shows a flow diagram depicting an embodiment of a method of processing semiconductor wafers according to the present disclosure.

FIG. 6 shows a graph depicting experimental results comparing CuO removal from a Cu layer via a direct ammonia plasma to removal via a remote hydrogen plasma.

FIG. 7 shows a graph depicting experimental results comparing damage caused to a low-k dielectric film by direct ammonia plasma treatment to that caused by remote hydrogen plasma treatments of differing time intervals.

DETAILED DESCRIPTION

Figure 3:
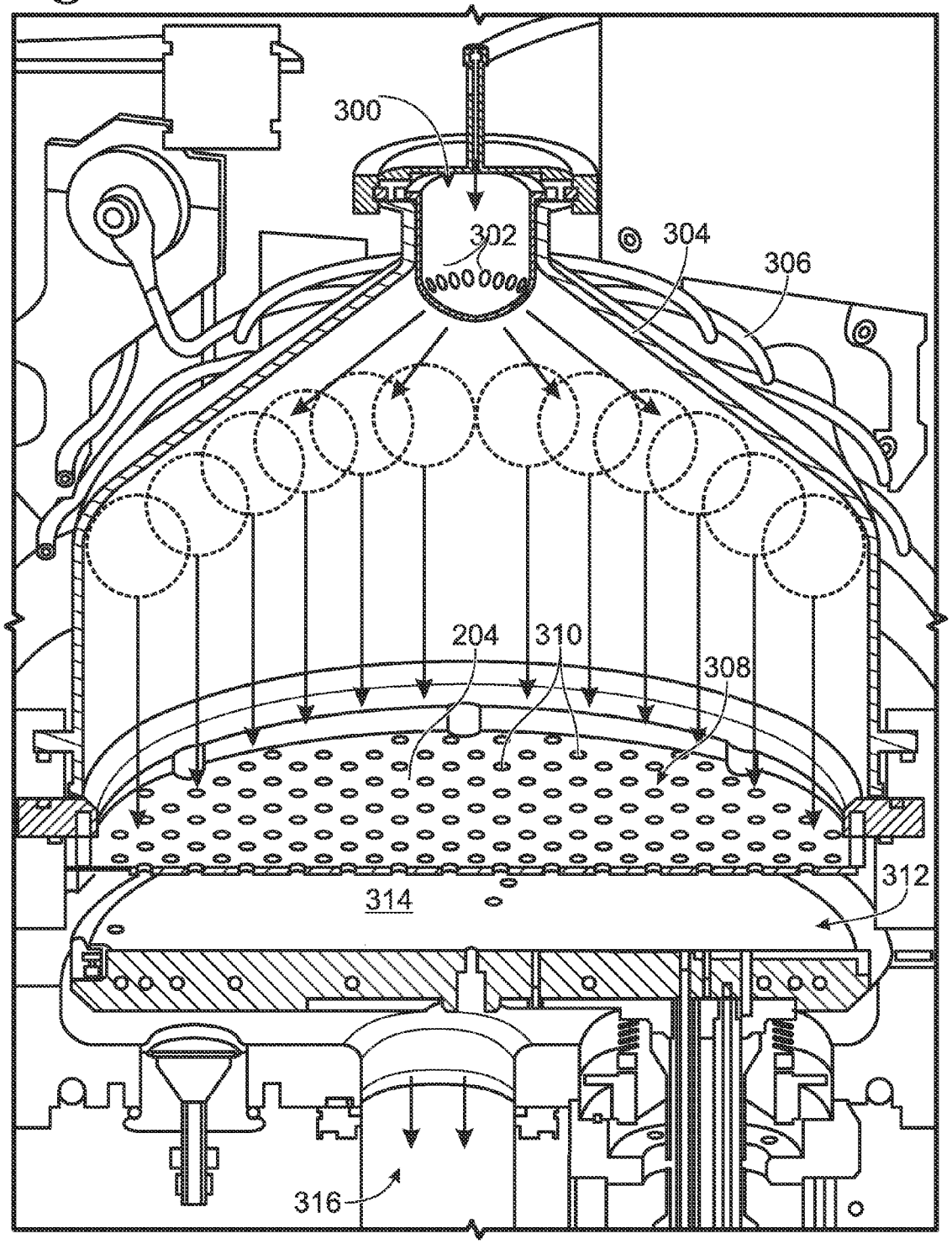
FIG. 3 shows a sectional view of an embodiment of the load lock and remote plasma source of FIG. 2.

Various embodiments are disclosed herein that are related to cleaning and/or otherwise processing interface surfaces in a semiconductor device with a remote plasma. As described in more detail below, the use of a remote plasma may allow a surface to be cleaned of metal oxides, carbon compounds, and potentially other contaminants in an efficient and effective manner, and with fewer effects on other materials that are exposed to the plasma, such as a low-k dielectric material. Further, such a remote plasma also may be used in other settings, such as to remove hydrogen from a low-k material after deposition of the low-k material, to clean a tungsten surface before deposition of layers such as a hard mask layer, to clean a PVD-deposited copper seed layer prior to a plating process, etc.

Prior to the discussion of the remote plasma processing of interface surfaces, an embodiment of an example semiconductor processing apparatus that comprises a load lock with a remote plasma source is described with reference to FIGS. 1-3. First, FIG. 1 shows a schematic view of an embodiment of a multi-station processing tool 100 with an inbound load lock 102 and an outbound load lock 104, either or both of which may comprise a remote plasma source. A robot 106, at atmospheric pressure, is configured to move wafers from a cassette loaded through a pod 108 into inbound load lock 102 via an atmospheric port 110. A wafer is placed by the robot 106 on a pedestal 112 in the inbound load lock 102, the atmospheric port 110 is closed, and the load lock is pumped down. Where the inbound load lock 102 comprises a remote plasma source, the wafer may be exposed to a remote plasma treatment in the load lock prior to being introduced into the processing chamber 114. Further, the wafer also may be heated in the inbound load lock 102 as well, for example, to remove moisture and adsorbed gases. Next, a chamber transport port 116 to processing chamber 114 is opened, and another robot (not shown) places the wafer into the reactor on a pedestal of a first station shown in the reactor for processing.

The depicted processing chamber 114 comprises four stations, numbered from 1 to 4 in FIG. 1. Each station has a heated pedestal (shown at 118 for station 1), and gas line inlets. In embodiments, where the processing chamber 114 is a PECVD processing chamber, each station also comprises a direct plasma source. As described above, one potential method of cleaning a surface of a wafer prior to forming another layer that interfaces the surface may involve exposing the wafer surface to a direct plasma for a period of time prior to introducing source gases for a PECVD deposition process. Such a plasma cleaning process may be used, for example, to reduce copper oxide residues on a copper surface to improve adherence of an etch stop layer (e.g. SiC) to the Cu. However, the impact of high energy ions formed in a direct plasma may cause an increase in the dielectric constant of a low-k dielectric material. This may increase RC delay, thereby impacting device performance. While the depicted processing chamber 114 comprises four stations, it will be understood that a processing chamber according to the present disclosure may have any suitable number of stations. For example, in some embodiments, a processing chamber may have five or more stations, while in other embodiments, a processing chamber may have three or fewer stations.

Therefore, the use of a remote plasma to clean the Cu surfaces prior to etch stop deposition may allow copper oxides to be reduced without subjecting the wafer surface to the high energy ion impacts found in a direct plasma. A remote plasma treatment is primarily a chemical treatment, and helps to reduce effects associated with ion bombardment. Further, performing the remote plasma cleaning in the inbound load lock 102, rather than in the processing chamber 114, may provide for higher throughput, as the remote plasma cleaning process in the load lock may be performed in parallel with wafer processing at station 1. Any suitable reducing plasma may be used for such a cleaning process. Examples include, but are not limited to, $N_2$, $NH_3$, $H_2$, and mixtures thereof.

Likewise, a CMP process may deposit intentionally or unintentionally various hydrocarbon compounds. Therefore, it is possible that some quantity of carbon may remain on a wafer surface after a CMP process. In this case, a remote plasma cleaning process may be used to clean the surface of such carbon residues. Any suitable plasma may be used for such a carbon removal process. Examples include, but are not limited to, the above-mentioned reducing plasmas, as well as an oxidizing plasma such as $CO_2$, and mixtures thereof.

In some embodiments, the outbound load lock 104 may comprise a remote plasma source configured to treat a wafer surface with a remote plasma, either in addition to or instead of the remote plasma source at the inbound load lock 102. A remote plasma source may be used in the outbound load lock 104, for example, in a low-k dielectric deposition tool to remove hydrogen from a low-k film after deposition. Yet other applications for a remote plasma cleaning process include, but are not limited to, the cleaning of a tungsten surface prior to the deposition of a hard mask, such as an ashable hard mark, and the cleaning of a physical vapor deposition (PVD) copper film prior to a plating process, either via electroplating or electroless plating. It will be understood that these specific embodiments are presented for example, and are not intended to be limiting in any manner. Other metal surfaces that may be cleaned via a remote plasma process include, but are not limited to, nickel and nickel alloys, cobalt and cobalt alloys, tantalum and tantalum nitride, and metal silicides.

Further, it will be appreciated that, in some embodiments, station 1 of processing tool 100 may be configured to be a remote plasma cleaning station. In this case, additional wafer processing (e.g. PECVD) may be performed at stations 2-4 while remote plasma cleaning occurs at station 1. However, as described above, performing the remote plasma cleaning in the load lock, as well as wafer heating in the load lock, may allow stations 1-4 of processing tool 100 to be used for other processes in parallel with the remote plasma cleaning. In essence, the use of the remote plasma source with the load lock provides an additional processing station to the multi-station processing tool 100.

FIG. 2 shows one example embodiment of a load lock 200 coupled to a processing chamber 201 and comprising a remote plasma source 202. The remote plasma source 202 comprises an RF generator (including an impedance matching circuit) and an inductively coupled plasma source, which is shown in more detail in FIG. 3 (discussed below). In other embodiments, a capacitively coupled plasma, microwave plasma, or any other suitable plasma source may be used. The use of an inductively coupled plasma may help to reduce sputter-induced damage of the plasma source compared to a capacitively coupled plasma.

The load lock 200 further comprises an ion filter 204 configured to remove ions from the remote plasma flow to help prevent low-k degradation caused by ion bombardment. In the depicted embodiment, the ion filter 204 takes the form of a porous plate disposed at an outlet of the remote plasma source 202. The plate comprises a plurality of through holes configured to direct a remote plasma flow onto a wafer positioned on the pedestal in the load lock chamber 206 in a direction normal to the wafer surface. The ion filter 204 is discussed in more detail with reference to FIG. 3 below. It will be understood that the term "normal to the wafer surface" refers to a direction of the through-holes in the ion filter through which the remote plasma flows, and encompasses directions within an acceptable tolerance range off of the normal, depending upon the specific configurations of a load lock. Further, in some embodiments, the remote plasma source may be configured to direct a flow of remote plasma in any other suitable direction than normal. It will be further be understood that any other suitable ion filter may be used instead of, or in addition to, the depicted ion filter. Examples of other suitable ion filters include, but are not limited to, a charged mesh, a charged wall (e.g. where a charge is applied to a wall of the plasma source), an electron source, such as a hot wire configured to provide electrons to reduce cations, etc. In some embodiments, the load lock also may include an ultraviolet light source configured to direct ultraviolet light onto a substrate surface.

FIG. 3 shows a sectional view of load lock 200 and remote plasma source 202. The RF generator of the remote plasma source 202 is omitted for clarity. The remote plasma source 200 comprises a gas inlet 300 with a plurality of holes 302 configured to distribute a desired gas into an internal volume of the remote plasma source 200 in a desired pattern. It will be understood that the gas inlet 300 may be coupled to a multichannel gas box (not shown) to allow desired gases or gas mixes to be delivered to the gas inlet 300.

The remote plasma source 202 further comprises a wall 304 surrounded by an inductive coil 306. In the depicted embodiment, the wall 304 takes the form of a bell-shaped vessel, but it will be understood that the wall 304 may have any other suitable configuration. Likewise, the wall 304 may be made of any suitable material. Examples of suitable materials include, but are not limited to, quartz.

The wall 304 comprises a generally circular opening that forms an outlet 308 of the remote plasma source 202. The outlet 308 may have any suitable size relative to a wafer intended for use in the load lock. For example, in some embodiments, the outlet 308 has a diameter that is equal to or greater than a diameter of a wafer for which the load lock 200 is intended for use. This may help to ensure that the entire wafer surface encounters a substantially uniform incident flux of remote plasma. In other embodiments, the outlet 308 may have a diameter that is suitably smaller than the diameter of the wafer, such that any uneven processing caused by an unequal remote plasma flux on the wafer surface does not result in a surface outside of acceptable tolerances.

Continuing with FIG. 3, the ion filter 204 can be seen to comprise a plate disposed across the outlet of the remote plasma source. The plate comprises a plurality of through-holes 310 configured to pass a flow of remote plasma into the load lock chamber 312 toward a wafer pedestal 314 located within the load lock chamber 312. In some embodiments, the pedestal 314 may be heated to allow a pre-PECVD "soak" to be performed in the load lock 200 in addition to a remote plasma treatment. This may help to remove residual moisture and adsorbed gases on the low-k dielectric. The load lock 202 also comprises a gas outlet 316 to allow the load lock to be pumped down and maintained at a desired vacuum during soak and remote plasma treatment, as well as to remove byproducts from the remote plasma treatment process.

As mentioned above, the through-holes 310 of the depicted embodiment are oriented to have a direction of flow normal to a wafer-supporting surface of the wafer pedestal 314, and therefore normal to a wafer positioned on the pedestal surface. However, the through-holes 310 may have any other suitable configuration than that shown. Further, the through-holes 310 may have any suitable dimensions relative to the thickness of the ion filter plate. The relative size and length of the through-holes may affect an ion flux transmission through the filter. FIG. 4 shows a graph 400 depicting a normalized ion flux transmission through the ion filter 204 as a function of the geometry factor of the through-holes 310 for two different ion filters having different hole patterns, wherein the geometry factor is an aspect ratio defined by a plate thickness compared to a through-hole diameter. As can be seen, the ion flux transmission for each filter follows a similar curve. Generally, ion flux is relatively high through each filter until a geometry factor of about two, and drops to essentially zero around a geometry factor of three. Therefore, in order to reduce ion flux to essentially a value of zero, the ion filter 204 may be configured to have through-holes each with ratio of length (i.e. plate thickness) to diameter of three or more.

The ion filter 204 may be made from any suitable material. Suitable materials may include, but are not limited to, thermally insulating materials such as quartz, as well as thermally conductive materials such as aluminum and other metals. The use of a thermally conductive material for the ion filter 204 may allow the ion filter to be cooled by conducting heat to a thermally conductive outer wall of the load lock 200 and/or remote plasma source 202. It will be understood that the ion filter may be spaced any suitable distance from a surface of a wafer located in the load lock, and may be adjustable in some embodiments (e.g. a movable pedestal may allow a wafer to be raised or lowered).

Likewise, the plasma source may be operated at any suitable power to form a plasma of a desired composition of radical species. Examples of suitable powers include, but are not limited to, powers between 300 W and 5000 W. Likewise, the RF power supply may provide RF power of any suitable frequency. One example of a suitable frequency for an inductively coupled plasma is 13.56 MHz.

The depicted configuration of the gas inlet 300, wall 304 and ion filter 204 may help to facilitate pumpdown of the load lock after wafer transfer. For example, by feeding an inert gas through the gas inlet 300, a back pressure may be created on the back side (i.e. opposite the pedestal) that may help to prevent condensation above a wafer on the pedestal, or the creation of a vacuum over the wafer. However, it will be understood that these parts may have any other suitable configuration.

Load lock 202 may be used in any suitable process. One specific example comprises the deposition of an etch stop layer over a Damascene structure post-CMP. FIG. 5 shows a flow diagram depicting an embodiment of a method 500 of treating a wafer with a remote plasma and then depositing an etch stop layer on the wafer. Method 500 comprises, at 502, inserting a wafer into an inbound load lock of a PECVD chamber, and then, at 504, heating the wafer in the load lock. As mentioned above, heating the wafer may help to remove moisture and adsorbed gases from the substrate surface. Next, at 506, method 500 comprises flowing a remote plasma over the wafer while the wafer is in the load lock. This may involve various subprocesses. For example, this may involve, at 508, forming a remote plasma via inductive, capacitive, microwave, or other suitable mechanism (and potentially performing other processes, such as exposing the substrate to ultraviolet light), and then, at 510, filtering ions from the remote plasma. In some embodiments, the remote plasma may be directed onto the wafer surface in a direction normal to the wafer surface, while in other embodiments, the remote plasma may be directed onto the wafer surface in any other suitable direction or directions.

The process of flowing a remote plasma over the wafer may have various chemical effects. For example, as indicated at 514, the remote plasma may reduce metal oxides on the substrate surface, such as copper oxides formed on the exposed copper portions of the wafer surface. Likewise, as indicated at 516, where the remote plasma process follows a CMP process, the remote plasma may remove carbon residues on the wafer surface by oxidation or other suitable process. It will be understood that any suitable gas or combination of gases may be used to form the remote plasma, including but not limited to the examples given above.

Continuing with FIG. 5, method 500 next comprises, at 518, transferring the wafer from the load lock into the PECVD chamber, and then, at 520 forming an etch stop layer on the wafer surface. Removal of copper oxides and residual carbon may help to improve adhesion of the etch stop layer to underlying copper, and also may help to avoid damage to the low-k dielectric layers in which the copper features are located. While performing the remote plasma treatment in a load lock may help to maintain, or even increase, system throughput, it will be understood that a remote plasma treatment to reduce copper oxides and/or remove carbon residues also may be performed in situ (i.e. in a PECVD or other deposition chamber). For example, station 1 of the processing tool 100 shown in FIG. 1 may be adapted to perform such a remote plasma treatment.

FIG. 6 shows a graph 600 that depicts results of experiments that compared CuO removal by various plasma treatments. To acquire the data depicted in FIG. 6, a layer of CU was deposited via PVD, and then an approximately 120 angstrom layer of $CuO_x$ was grown in an oxidizing plasma. Then, a rate of $CuO_x$ reduction was measured for the different plasma treatments tested. The leftmost two data bars in FIG.

6 depict the removal of $CuO_x$ via a direct ammonia plasma performed in situ in a PECVD chamber. As can be seen, about 50% of the $CuO_x$ was removed after six seconds of treatment, and the $CuO_x$ was essentially fully removed by twelve seconds of treatment.

Next, the rightmost two data bars in FIG. 6 depict the removal of $CuO_x$ via a remote hydrogen plasma performed with a remote plasma source similar to that shown in FIG. 3. As can be seen, essentially all of the $CuO_x$ was removed after five seconds of treatment. Therefore, remote plasmas may offer a higher rate of copper oxide reduction than direct plasmas.

FIG. 7 shows a graph 700 depicting results of experiments conducted to compare changes in low-k material performance as a function of plasma treatment conditions and time. First, the left-most bar in the graph shows a percent damage caused by an in situ direct ammonia plasma treatment that was performed for a time sufficient to reduce substantially all copper oxide, as shown in the graph of FIG. 6. Next, the four bars to the right of the in situ plasma bar show percent damages caused by remote hydrogen plasma treatments of time intervals of 5, 15, 30 and 60 seconds, respectively. Starting thickness of the low-k material is approximately 2000 angstroms for each experiment. From the results shown in this graph, it can be seen that the remote hydrogen plasma treatment caused essentially no damage to the low-k layer for process times of 15 seconds or less. Further, as shown in FIG. 6, process times of 5 seconds were sufficient to remove essentially all copper oxide from the wafer surface. Therefore, from the results of FIGS. 6 and 7, it can be seen that a remote hydrogen plasma treatment may allow the removal of copper oxides from a wafer surface while maintaining a desirably low dielectric constant for the low-k material.

Figure 8:
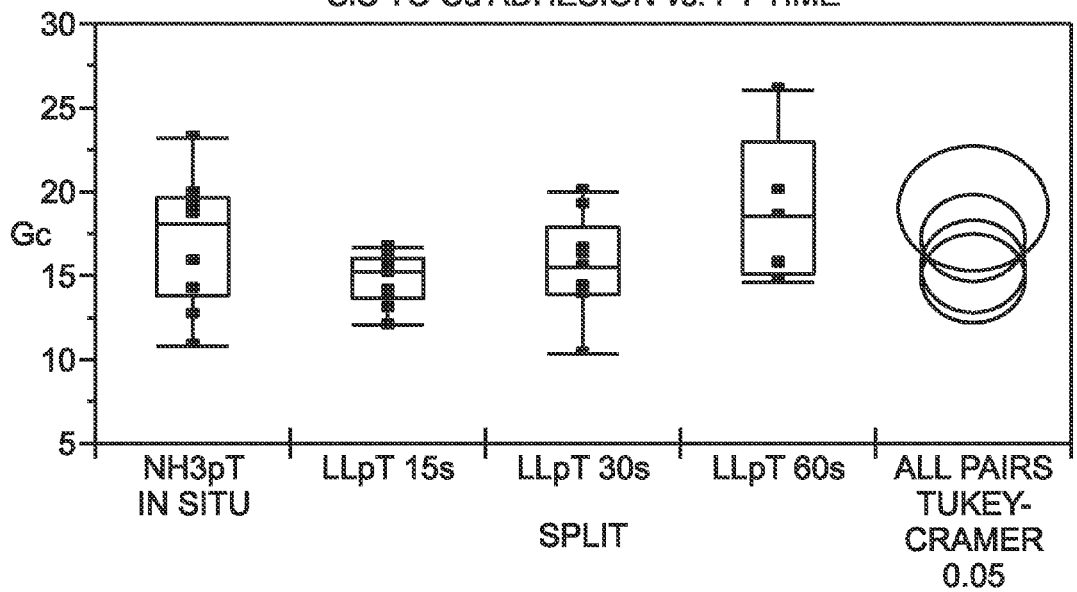
FIG. 8 shows a graph depicting experimental results comparing adhesion of a silicon carbide etch stop film to a copper film after various ammonia direct plasma and hydrogen remote plasma treatments.

FIG. 8 shows a graph 800 depicting results of experiments to determine the interfacial fracture energy (Gc) of silicon carbide films deposited on copper surfaces after performing various plasma treatments to reduce copper oxides on the copper surfaces. The leftmost bar depicts the adhesion of a silicon carbide film on a copper surface after an in situ ammonia direct plasma treatment, and the bars to the right depict the adhesion of silicon carbide films to copper surfaces after remote hydrogen treatments of 15, 30 and 60 seconds, respectively. Tukey-Cramer statistics for the results are presented as a right-most column in the graph, and imply that the distributions are matched. From graph 800, it can be seen that a fifteen second or less remote hydrogen plasma treatment may be sufficient to enable silicon carbide adhesion on copper with a similar interfacial fracture energy as for a copper surface treated with an in situ ammonia plasma.

Figure 9A:
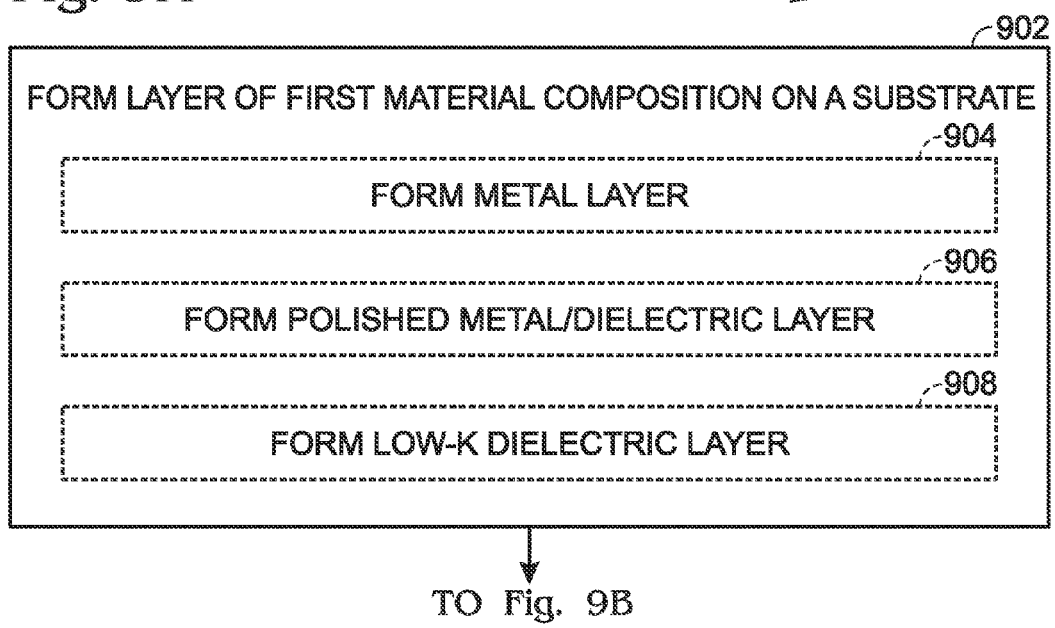
FIG. 9 shows a flow diagram depicting another embodiment of a method of processing a substrate according to the present disclosure.

As mentioned above, a remote plasma source may be used to treat wafer surfaces other than a copper/low-k surface treatment prior to etch stop deposition. FIG. 9 shows a generalized method 900 of utilizing a remote plasma source to treat a surface on a wafer prior to forming an interface layer. Method 900 comprises, at 902, forming a layer of a first material composition on a substrate. It will be understood that the terms "wafer" and "substrate" may be used interchangeably herein, and may refer to substrates other than silicon wafers. The first material composition may comprise, for example, a metal 904 (e.g. PVD of copper prior to a plating process), a polished metal/dielectric layer (e.g. a post-CMP copper or tungsten surface), a low-k dielectric layer, or any other suitable layer.

Next, at 910, the substrate is positioned in a remote plasma processing apparatus. For example, in some embodiments, as indicated at 912, the processing apparatus may comprise a load lock with a remote plasma source, such as the embodiments described herein. In the case of an etch stop deposition system or a plating system for plating copper or other metal onto a PVD-deposited seed layer, the load lock may be an incoming load lock 914. Likewise, in the case of a low-k dielectric film deposition system, the load lock may be an outgoing load lock 916. Further, in yet other embodiments, both an incoming and outgoing load lock for a processing chamber may each comprise a remote plasma source. In other embodiments, as indicated at 918, the remote plasma processing apparatus comprises a dedicated processing chamber, a dedicated station in a multi-station processing tool chamber, or the like.

Method 900 next comprises, at 920, generating a remote plasma, and filtering ions from the remote plasma. In some embodiments, the remote plasma may be generated from a reducing gas or gas mixture 922, while in other embodiments, the remote plasma may be generated from an oxidizing gas or gas mixture 924. Further, in yet other embodiments, the remote plasma may be generated from both oxidizing and reducing gases.

Next, as indicated at 926, method 900 comprises flowing the remote plasma generated at 920 over the layer of the first material composition. In some embodiments, the remote plasma flow may be directed onto the layer of the first material composition in a direction generally normal to the surface of the substrate. In such embodiments, as described above, the remote plasma source may be configured to have an outlet with a diameter equal to or larger than the diameter of a wafer being processed. In one specific example, a remote plasma source with a 12" diameter outlet may be used to process a 300 mm wafer. In other embodiments, the remote plasma may be directed onto the layer in any other suitable direction or directions. Further, in some embodiments, the substrate may be exposed to UV light while positioned in the remote plasma processing apparatus, as indicated at 927, either during, before, and/or after a remote plasma treatment.

As described above, the remote plasma treatment may chemically modify species such as oxides, carbon, and/or hydrocarbons on the surface. Further, in other embodiments the remote plasma treatment may modify bulk properties of the first material. For example, where the layer of the first material comprises a low-k dielectric layer, the remote plasma treatment may remove Si—H, Si—$CH_x$, and/or Si—OH bonds in the low-k material matrix.

After performing the remote plasma over the layer of the first material composition, method 900 next comprises, at 928, forming a layer of a second material composition on the layer of the first material composition. For example, where the layer of the first material composition comprises a surface with copper and low-k dielectric regions, the layer of the second material composition may comprise a silicon carbide (or other) etch stop layer, as indicated at 930. In another specific example, where the layer of the first material comprises tungsten, the layer of the second material may comprise, for example, a hard mask layer 932. It will be understood that these specific embodiments are described for the purpose of example, and are not intended to be limiting in any manner.

Therefore, a remote plasma may be used to remove metal oxide and carbon deposits, as well as potentially other residues, from a wafer surface with an efficacy comparable to an in situ ammonia plasma, while causing a lesser degree, or even no, degradation to a low-k layer exposed to the remote plasma. Further, the disclosed remote plasma treatment apparatus and processes also may be used to post-treat a low-k film to remove hydrogen and/or carbon from the film. It be understood that the configurations and/or approaches for the remote plasma treatment of interface surfaces in a semiconductor device fabrication process described herein are exemplary in nature, and that these specific embodiments or examples are not to be considered in a limiting sense, because numerous variations are possible. For example, any of the above-described load locks may comprise an ultraviolet light source in addition to a remote plasma source. This may allow curing steps, heating steps, and the like to be performed in a same processing area as a remote plasma treatment.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. In a semiconductor processing apparatus, a method of forming an etch stop layer over a wafer with a surface comprising a metal region and a dielectric material region, the method comprising:
   inserting the wafer into an inbound load lock that is coupled to a plasma enhanced chemical vapor deposition chamber;
   heating the wafer in the inbound load lock;
   flowing a remote plasma over the surface of the wafer while the wafer is in the inbound load lock;
   transferring the wafer from the inbound load lock into the plasma enhanced chemical vapor deposition chamber; and
   forming an etch stop layer over the surface of the wafer.

2. The method of claim 1, wherein flowing the remote plasma over the surface of the wafer comprises reducing a metal oxide on a metal portion of the surface.

3. The method of claim 1, wherein flowing the remote plasma over the surface of the wafer comprises introducing a flow of the remote plasma over the wafer in a flow direction substantially normal to the surface of the wafer.

4. The method of claim 3, wherein flowing the remote plasma over the surface of the wafer in the flow direction substantially normal to the surface of the wafer comprises introducing a remote plasma flow via a remote plasma source with an outlet diameter equal to or greater than a diameter of the wafer.

5. The method of claim 1, further comprising flowing the remote plasma through an ion filter comprising a plate with a plurality of through-holes each having a length to diameter ratio of three or more.

6. The method of claim 1, wherein the remote plasma comprises one or more of a reducing gas and an oxidizing gas, and wherein flowing the remote plasma over the surface of the wafer comprises one or more of reducing metal oxides and oxidizing carbon residues on the surface of the wafer.

7. In a semiconductor processing apparatus, a method of forming an interface between two layers of different material compositions, the method comprising:
   forming a layer of a first material composition on a substrate;
   positioning the substrate in a remote plasma processing apparatus;
   generating a remote plasma and filtering ions from the remote plasma;
   flowing the remote plasma over a surface of the layer of the first material composition; and
   forming a layer of a second material composition on the surface of the layer of the first material composition to thereby form the interface between the layer of the first material composition and the layer of the second material composition of different material compositions.

8. The method of claim 7, wherein the layer of the first material composition comprises a metal region and a dielectric region, wherein the layer of the second material composition comprises a layer of an etch stop material, and wherein forming the layer of the second material composition comprises forming the layer of the second material composition by plasma enhanced chemical vapor deposition.

9. The method of claim 8, further comprising forming the surface of the first material via chemical mechanical polishing before flowing the remote plasma over the surface of the first material.

10. The method of claim 7, wherein positioning the substrate in a remote plasma processing apparatus comprises positioning the substrate in an inbound load lock for a plasma enhanced CVD system.

11. The method of claim 7, wherein the layer of the first material composition comprises tungsten, and wherein the layer of the second material composition comprises a hard mask layer.

12. The method of claim 7, wherein flowing the remote plasma over the surface of the layer of the first material composition, in a direction normal to the surface of the layer of the first material comprises introducing a remote plasma flow via a remote plasma source with an outlet diameter equal to or greater than a diameter of the substrate.

13. The method of claim 7, wherein the remote plasma processing apparatus comprises a load lock coupled to a remote plasma source.

14. The method of claim 7, wherein the remote plasma processing apparatus comprises a processing station in a multi-station processing tool.

15. The method of claim 7, wherein the layer of the first material composition comprises a low-k dielectric material, and wherein positioning the substrate in a remote plasma processing apparatus comprises positioning the substrate in an outbound load lock coupled to a low-k dielectric material deposition chamber.

16. The method of claim 7, further comprising exposing the substrate to ultraviolet light while the substrate is positioned in the remote plasma processing apparatus.

* * * * *

UNITED STATES PATENT AND TRADEMARK OFFICE
CERTIFICATE OF CORRECTION

PATENT NO. : 8,084,339 B2
APPLICATION NO. : 12/484047
DATED : December 27, 2011
INVENTOR(S) : Antonelli et al.

Page 1 of 1

It is certified that error appears in the above-identified patent and that said Letters Patent is hereby corrected as shown below:

IN THE CLAIMS:
Claim 7

Column 10, line 13 change "rial composition of different material compositions." to read
-- rial composition. --.

Signed and Sealed this
Eighteenth Day of June, 2013

Teresa Stanek Rea
*Acting Director of the United States Patent and Trademark Office*